(12) United States Patent
Kumagai et al.

(10) Patent No.: US 11,035,892 B2
(45) Date of Patent: Jun. 15, 2021

(54) ELECTRIC POWER SYSTEM MONITORING APPARATUS AND ELECTRIC POWER SYSTEM MONITORING METHOD

(71) Applicant: Hitachi, Ltd., Tokyo (JP)

(72) Inventors: Masatoshi Kumagai, Tokyo (JP); Shota Omi, Tokyo (JP); Kenichirou Yamane, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 387 days.

(21) Appl. No.: 15/773,022

(22) PCT Filed: Nov. 9, 2016

(86) PCT No.: PCT/JP2016/083151
§ 371 (c)(1),
(2) Date: May 2, 2018

(87) PCT Pub. No.: WO2017/090428
PCT Pub. Date: Jun. 1, 2017

(65) Prior Publication Data
US 2018/0313876 A1      Nov. 1, 2018

(30) Foreign Application Priority Data
Nov. 24, 2015   (JP) .............................. JP2015-228471

(51) Int. Cl.
*G01R 21/133* (2006.01)
*H02J 3/00* (2006.01)
(Continued)

(52) U.S. Cl.
CPC .............. *G01R 21/133* (2013.01); *H02J 3/00* (2013.01); *H02J 13/00* (2013.01); *G01R 31/343* (2013.01); *H02J 2203/20* (2020.01)

(58) Field of Classification Search
CPC .......... H02J 3/00; H02J 13/00; H02J 2203/20; H02J 13/00002; H02J 3/36; G01R 19/2513
(Continued)

(56) References Cited

U.S. PATENT DOCUMENTS 7,233,843 B2 * 6/2007 Budhraja .......... H02J 13/00001
700/291
2004/0243329 A1 * 12/2004 Seki .................... G01R 19/2506
702/75
(Continued)

FOREIGN PATENT DOCUMENTS

JP       10-257674 A     9/1998
JP       10-271686 A    10/1998
(Continued)

OTHER PUBLICATIONS

Anderson , ("Validation of On-Line Power System Dynamics Measurements", 1999, IEEE) (Year: 1999).*
(Continued)

*Primary Examiner* — Catherine T. Rastovski
*Assistant Examiner* — Aeysha N Sultana
(74) *Attorney, Agent, or Firm* — Crowell & Moring LLP

(57) ABSTRACT

There is provided an electric power system monitoring apparatus that can estimate dynamic behavior constants using measurement signals and can obtain the accuracy of an estimation result. An apparatus according to the present invention that monitors an electric power system includes a dynamic behavior constant estimation unit to estimate a predetermined dynamic behavior constant from a measurement value obtained from the electric power system, a relative accuracy calculation unit to calculate, from the measurement value, a relative accuracy index that indicates accuracy of a dynamic behavior constant estimation value
(Continued)

estimated at the dynamic behavior constant estimation unit, and an estimation error calculation unit to calculate an estimation error from reference dynamic behavior information, the dynamic behavior constant estimation value, and the relative accuracy index. Thus, after the accuracy of a dynamic behavior constant estimation value is grasped, a process using the estimation value can be executed.

15 Claims, 12 Drawing Sheets

(51) Int. Cl.
*H02J 13/00* (2006.01)
*G01R 31/34* (2020.01)

(58) Field of Classification Search
USPC .......................................................... 702/61
See application file for complete search history.

(56) References Cited

U.S. PATENT DOCUMENTS

| | | | | |
|---|---|---|---|---|
| 2012/0022713 | A1* | 1/2012 | Deaver, Sr. | G05B 17/02 |
| | | | | 700/298 |
| 2013/0304266 | A1* | 11/2013 | Giannakis | G01R 21/133 |
| | | | | 700/286 |
| 2014/0142862 | A1* | 5/2014 | Umeno | G06Q 10/04 |
| | | | | 702/19 |
| 2015/0066402 | A1* | 3/2015 | Feng | G01R 19/2513 |
| | | | | 702/60 |
| 2017/0046458 | A1* | 2/2017 | Meagher | H02J 13/0003 |

FOREIGN PATENT DOCUMENTS

| | | | |
|---|---|---|---|
| JP | 2006-238664 A | | 9/2006 |
| JP | 2010193535 A | * | 9/2010 |
| JP | 2010-226906 A | | 10/2010 |
| JP | 2015-109729 A | | 6/2015 |

OTHER PUBLICATIONS

Hartmann et al.,"Effects of decreasing synchronous inertia on power system dynamics—Overview of recent experiences and marketisation of services" Jun. 2019 (Year: 2019).*
2. Beltran et al., "Inertia Estimation of Wind Power Plants Based on Swing Equation and Phasor Measurement Units", Nov. 28, 2018 (Year: 2018).*
Extended European Search Report issued in counterpart European Application No. 16868376.1 dated Jul. 8, 2019 (six (6) pages).
Huang et al., "Capturing Real-Time Power System Dynamics: Opportunities and Challenges", IEEE, Jul. 26, 2015, XP33225049, (five (5) pages).
Manandhar et al., "Attacks/Faults Detection and Isolation in the Smart Grid using Kalman Filter", IEEE, Aug. 4, 2014, XP32651835, (six (6) pages).
International Search Report (PCT/ISA/210) issued in PCT Application No. PCT/JP2016/083151 dated Jan. 31, 2017 with English-language translation (Five (5) pages).
Japanese-language Written Opinion (PCT/ISA/237) issued in PCT Application No. PCT/JP2016/083151 dated Jan. 31, 2017 (three (3) pages).

* cited by examiner

| REFERENCE POWER GENERATOR INFORMATION MANAGEMENT TABLE ||
| --- | --- |
| POWER GENERATOR NODE # (C100) | REFERENCE DYNAMIC BEHAVIOR CONSTANT (INERTIA CONSTANT) (C101) |
| G1 | 8.0 |
| G3 | 6.0 |
| ... | ... |

FIG. 5

| DYNAMIC BEHAVIOR CONSTANT ESTIMATION VALUE MANAGEMENT TABLE | T11 |
|---|---|
| POWER GENERATOR NODE # (C110) | DYNAMIC BEHAVIOR CONSTANT ESTIMATION VALUE (INERTIA CONSTANT) (C111) |
| G1 | 8.5 |
| G2 | 9.5 |
| G3 | 5.5 |
| G4 | 8.0 |
| ... | ... |

ELECTRIC POWER SYSTEM MONITORING APPARATUS AND ELECTRIC POWER SYSTEM MONITORING METHOD

TECHNICAL FIELD

The present invention relates to a power system monitoring apparatus and a power system monitoring method.

BACKGROUND ART

An apparatus that monitors an electric power system for stably operating an electric power system has to grasp characteristics (dynamic behavior constants) relating to the swing of the electric power system. Examples of the dynamic behavior constants relating to the swing of the electric power system include an inertia constant, a damping factor, and a synchronizing power coefficient.

The inertia constant is derived from the rotating mass of a synchronous generator or a prime mover interconnected to an electric power system. The damping factor is derived from the damping torque of a synchronous generator having a PSS (Power System Stabilizer) or the frequency response of a load. The synchronizing power coefficient is derived from a change in a power transmission capacity due to voltages at power receiving and transmission ends or phase difference angles.

The inertia constant is changed by paralleling off a synchronous generator or a prime mover. Since system operators grasp the parallel off of large-sized synchronous generators, they can calculate the inertia constant based on the specifications of large-sized synchronous generators. Conventionally, since the ratio of the mass of the large-sized synchronous generator is high, the parallel off of small-sized synchronous generators, such as distributed power supplies and prime movers, is not greatly affected on the accuracy of the inertia constant.

However, in recent years, with the wide spread used of asynchronous generators represented by wind power generators and solar photovoltaic power generators, the use of large-sized synchronous generators is reduced, and the ratio of the mass of small-sized synchronous generators that occupies the inertia constant is increasing. The number of small-sized synchronous generators is large, and the operating states of the individual small-sized synchronous generators are unknown. Thus, the mass of the small-sized synchronous generators is the error factor of the inertia constant.

Also in the calculation of the damping factor, the damping torque of the large-sized synchronous generator including a PSS is conventionally dominant similarly to the inertia constant, and the frequency response of the load is taken as a rough change, such as seasons and daytime/nighttime. However, with a decrease in the number of large-sized synchronous generators, a change in the frequency response of the load is being noticeable as an error factor. In recent years, the technological development of power electronics devices having active control characteristics and distributed power supplies is advancing. When these devices and power supplies are widely used in electric power systems, a dynamic change in the damping factor is expected.

Since the synchronizing power coefficient is changed due to the difference in the phase difference angle between power receiving and transmission ends in the equilibrium state, or voltages at power receiving and transmission ends, or line impedance, the synchronizing power coefficient is dynamically changed depending on power flow states and switching of systems. Depending on regions, frequent switching of systems and a lack of facility information, for example, are also the error factors of the synchronizing power coefficient. Dynamic behavior constants other than the inertia constant, the damping factor, and the synchronizing power coefficient, which are taken as examples above, are also changed depending on electric power system configurations and operating states.

Therefore, instead of methods of calculating dynamic behavior constants from a physical model based on power generator specifications or facility information, a method of estimating dynamic behavior constants by optimization calculation based on the measurement values of an electric power system (Patent Literature 1). Patent Literature 1 describes that "a method, an apparatus, and a program for estimating a dynamic behavior constant of an electric power system are provided in which the value of a dynamic behavior constant is calculated by a nonlinear least squares method using an analysis result data output obtained from analysis data including an uncertain dynamic behavior constant and a data point series stored in advance, and hence a plurality of uncertain dynamic behavior constants in an analysis target model can be simultaneously highly accurately estimated using response data, for example, in observing a phenomenon in the system or in testing the system even in the case where the analysis target model for electric power system analysis has nonlinear characteristics".

CITATION LIST

Patent Literature

Patent Literature 1: Japanese Unexamined Patent Application Publication No. 2006-238664

SUMMARY OF INVENTION

Technical Problem

The technique described in Patent Literature 1 simultaneously highly accurately estimates a plurality of uncertain dynamic behavior constants in the analysis target model using response data when a phenomenon, such as power failure, occurs in the electric power system, or response data in testing the system, and any other data.

However, the technique in Patent Literature 1 is based on response data, for example, that is measured when failure occurs in the electric power system. That is, the technique in Patent Literature 1 is based on the premise that measurement signals observed in association with large disturbance are used. The technique fails to determine the accuracy of a dynamic behavior constant estimated from weak measurement signals.

Therefore, the technique described in Patent Literature 1 fails to estimate the dynamic behavior constant changed all the time due to small-sized synchronous generators, loads, and distributed power supplies, for example, from measurement signals observed in association with small disturbance. Consequently, the technique in Patent Literature 1 fails to use the estimated dynamic behavior constant for analysis or control of the swing of the system after determining the estimation accuracy of the dynamic behavior constant.

The present invention is made in view of the problems. An object is to provide an electric power system monitoring apparatus and an electric power system monitoring method that can estimate dynamic behavior constants using measurement signals and can obtain the accuracy of the estimation result.

Solution to Problem

In order to solve the problems, an electric power system monitoring apparatus according to the present invention is an apparatus for monitoring an electric power system, the apparatus including: a dynamic behavior constant estimation unit to estimate a predetermined dynamic behavior constant from a measurement value obtained from an electric power system; a relative accuracy calculation unit to calculate, from the measurement value, a relative accuracy index that indicates accuracy of a dynamic behavior constant estimation value estimated at the dynamic behavior constant estimation unit; and an estimation error calculation unit to calculate an estimation error from reference dynamic behavior information, the dynamic behavior constant estimation value, and the relative accuracy index.

Advantageous Effects of Invention

According to the present invention, a dynamic behavior constant can be estimated using a measurement signal obtained from an electric power system, and the estimation error of a dynamic behavior constant estimation value can be calculated. Accordingly, after the accuracy of the dynamic behavior constant estimation value is grasped, a process using the dynamic behavior constant estimation value can be executed.

BRIEF DESCRIPTION OF DRAWINGS

FIG. 5 is a table that manages a dynamic behavior constant estimation value.

DESCRIPTION OF EMBODIMENTS

In the following, embodiments of the present invention will be described with reference to the drawings. As described later, an electric power system monitoring apparatus 1 according to an embodiment receives inputs of measurement values and reference power generator information of an electric power system 2. The electric power system monitoring apparatus 1 includes a dynamic behavior constant estimation unit to estimate a dynamic behavior constant from a measurement value, a relative accuracy calculation unit to calculate the relative accuracy index of a dynamic behavior constant estimation value from a measurement value, and an estimation error calculation unit to calculate an estimation error from the dynamic behavior constant estimation value, the relative accuracy index, and the reference power generator information.

In accordance with the electric power system monitoring apparatus of the embodiment, a dynamic behavior constant can be estimated using a measurement signal having a given strength, and error information for determining the accuracy of the estimation result of the dynamic behavior constant can be provided.

First Embodiment

Figure 1:
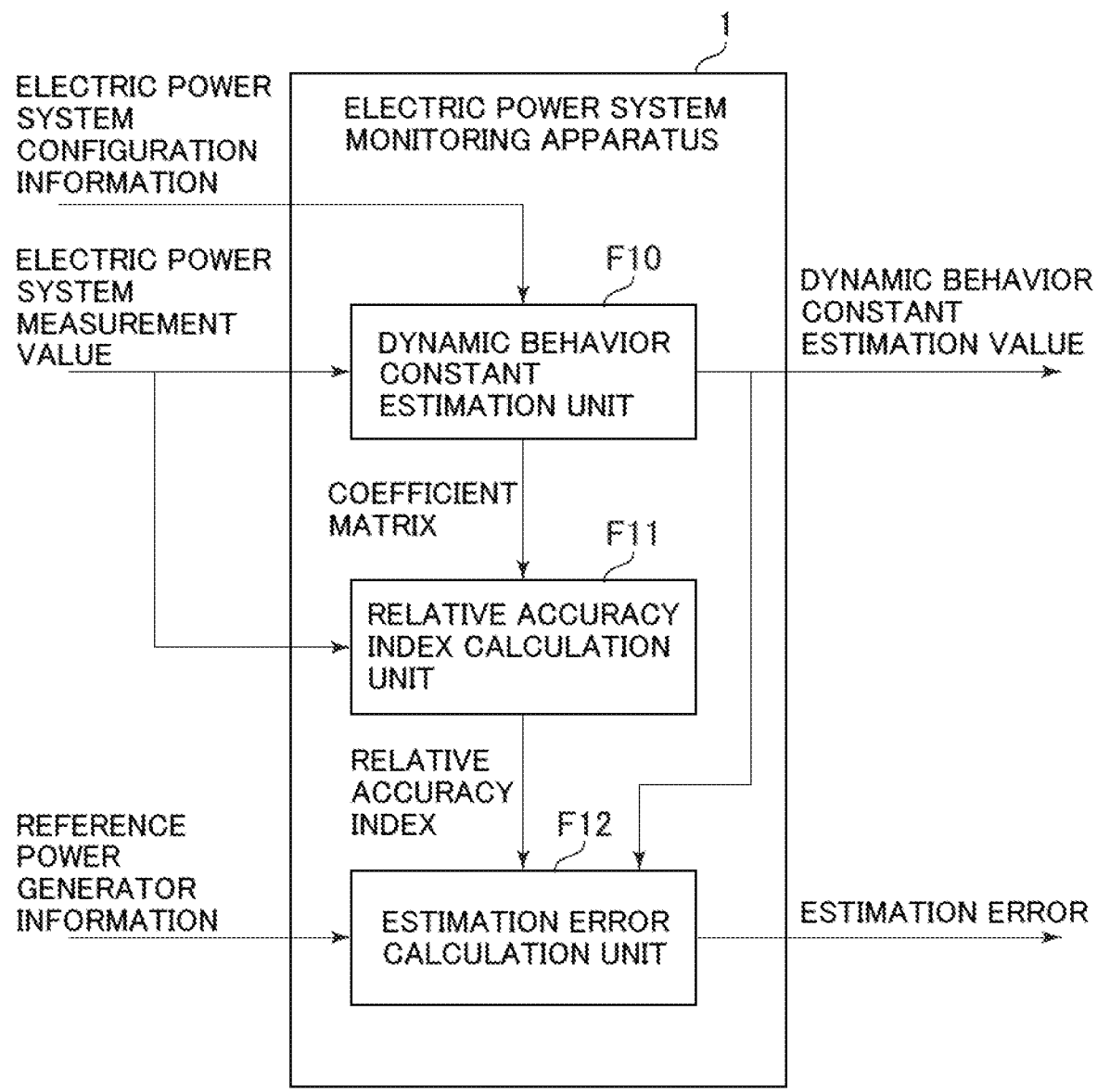
FIG. 1 is a functional block diagram of an electric power system monitoring apparatus.

Referring to FIGS. 1 to 7, a first embodiment will be described. FIG. 1 is a functional block diagram of an electric power system monitoring apparatus. An electric power system monitoring apparatus 1 is configured of a computer device as described later in FIG. 2. When attention is focused on its functions, the electric power system monitoring apparatus 1 includes, for example, a dynamic behavior constant estimation unit F10, a relative accuracy calculation unit F11, and an estimation error calculation unit F12. The electric power system monitoring apparatus 1 receives inputs of an electric power system measurement value that is an example of "a measurement signal obtained from an electric power system", electric power system configuration information, and reference power generator information that is an example of "reference dynamic behavior information", and outputs a dynamic behavior constant estimation value and an estimation error.

Process flows will be described later. However, the dynamic behavior constant estimation unit F10 estimates a dynamic behavior constant based on an electric power system measurement value and electric power system configuration information, and outputs the dynamic behavior constant as a dynamic behavior constant estimation value. The relative accuracy calculation unit F11 calculates a relative accuracy index that indicates the accuracy of the dynamic behavior constant estimation value from the electric power system measurement value and a matrix of coefficients obtained from the dynamic behavior constant estimation unit F10. The estimation error calculation unit F12 estimates an error of the dynamic behavior constant estimation value from the relative accuracy index, the dynamic behavior constant estimation value, and reference power generator information, and outputs the error as an estimation error.

Figure 2:
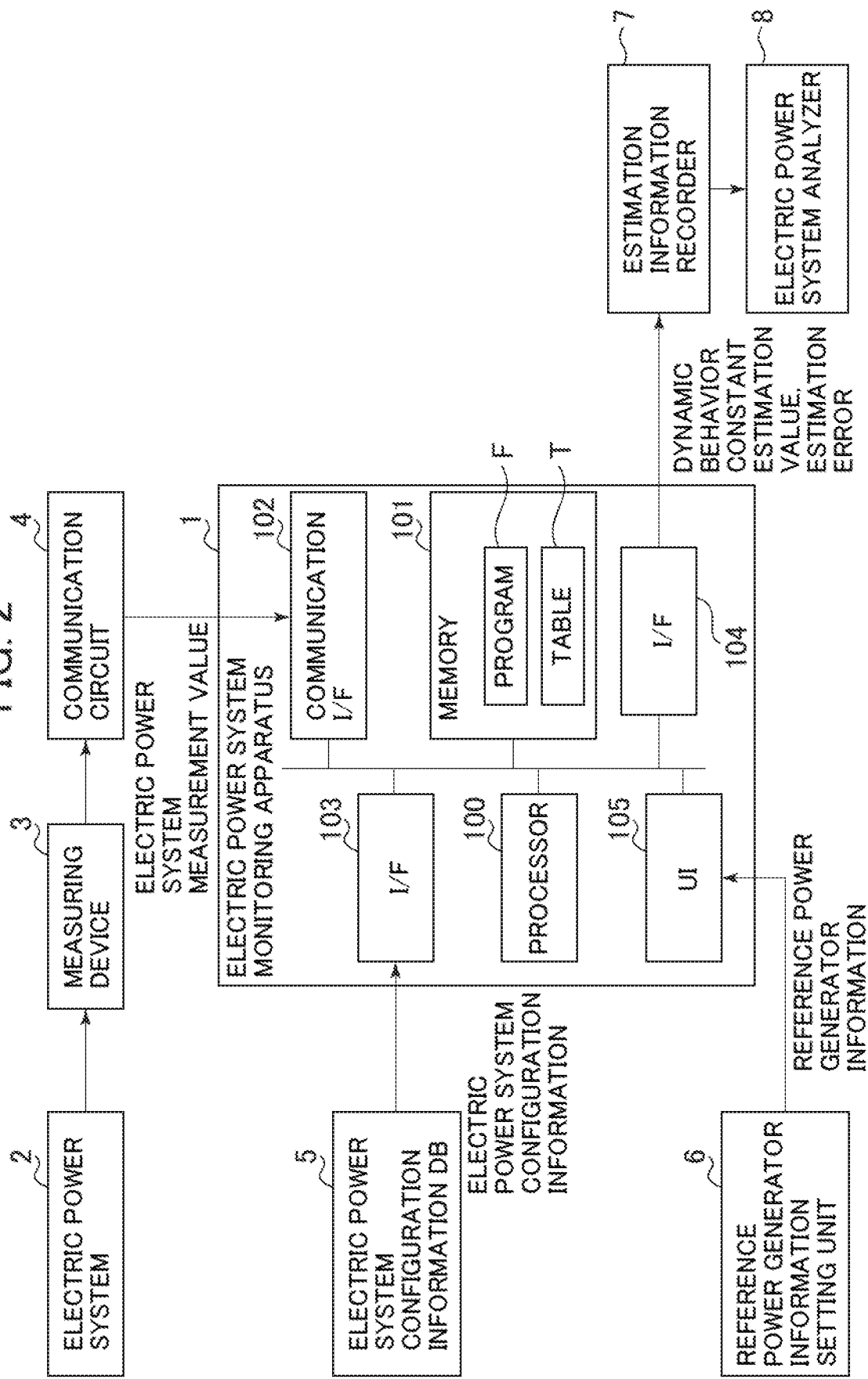
FIG. 2 is a block diagram of a system including the electric power system monitoring apparatus.

FIG. 2 is a block diagram of devices of a system including the electric power system monitoring apparatus 1. The electric power system monitoring apparatus 1 is a computer device including, for example, a processor 100, a memory 101, a communication interface (in the drawing, I/F) 102, interfaces 103 and 104, and a user interface 105. The memory 101 includes a main storage device and an auxiliary storage device. The memory 101 stores computer programs to implement the functions F10 to F12 illustrated in FIG. 1 and a table that manages information.

The communication interface 102 is a device that communicates with a communication circuit 4. The interface 103 is a device that reads electric power system configuration information from an electric power system configuration information DB 5. The interface 104 is a device that outputs a dynamic behavior constant estimation value and an estimation error to an estimation information recorder 7. The user interface 105 is a device with which a user using the electric power system monitoring apparatus 1 inputs reference power generator information. The user interface 105 can also display a screen described later and provide information to the user. Note that, information input-output methods for the electric power system monitoring apparatus 1 are not limited to the example described above. Using a shared interface, electric power system configuration information may be acquired from the database 5, the dynamic behavior constant estimation value and the estimation error may be outputted to the recorder 7, or reference power generator information may be acquired.

Various quantities of states of an electric power system 2, such as voltages, frequencies, and electric power, are measured by a measuring device 3, and are inputted as electric power system measurement values to the electric power system monitoring apparatus 1 through the communication circuit 4.

The electric power system configuration information that indicates the configuration of the electric power system 2 includes, for example, a system topology, the specifications of a main power generator, and any other data. The electric power system configuration information is recorded on the electric power system configuration information DB (database) 5, and is read by the electric power system monitoring apparatus 1.

A reference power generator information setting unit 6 sets a power generator to be a reference for calculating estimation errors as reference power generator information to the electric power system monitoring apparatus 1.

The dynamic behavior constant estimation value and the estimation error outputted from the electric power system monitoring apparatus 1 are recorded on the estimation information recorder 7. For example, in the case where the dynamic behavior constant estimation value is inputted to an electric power system analyzer 8 and used for stability analysis at the electric power system analyzer 8, the dynamic behavior constant estimation value and the estimation error are stored on the estimation information recorder 7 for showing the reliability of the analysis result.

Figures 3, 4:
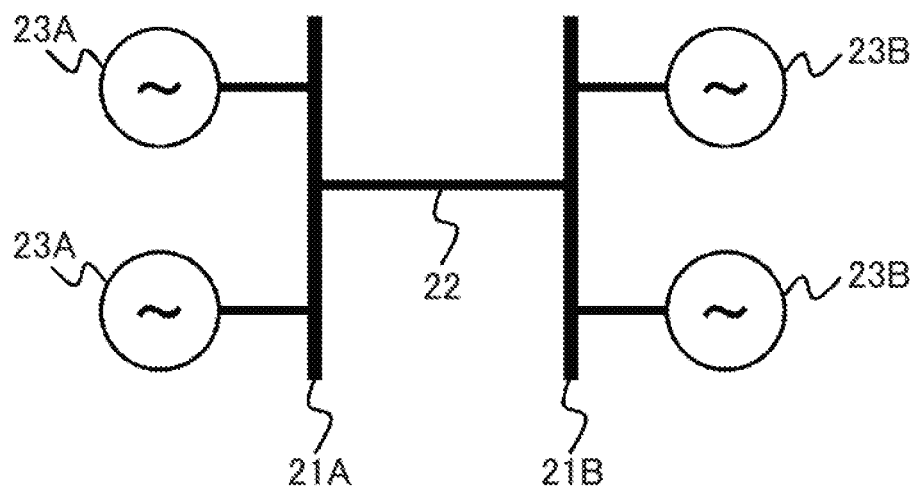
FIG. 3 is a schematic diagram of an electric power system.
FIG. 4 is a table that manages reference power generator information.

FIG. 3 is a schematic diagram of the electric power system 2 that is illustrated as a four generator system. The electric power system 2 includes one electric power line 21A, another electric power line 21B, a connecting wire 22 that connects the electric power lines 21A and 21B to each other as necessary, power generator nodes 23A of two generators connected to the one electric power line 21A, and power generator nodes 23B of two generators connected to the other electric power line 21B. In the following, the electric power lines 21A and 21B are referred to as the electric power line 21, and the power generator nodes 23A and 23B are referred to as the power generator node 23, unless otherwise specified. The power generator node 23 is an interconnection node of a power generator alone or a contraction power generator.

Here, an estimation method for the dynamic behavior constant performed at the dynamic behavior constant estimation unit F10 will be described. Examples that can be used for estimating the dynamic behavior constant include mathematical methods, such as a Kalman filter and a sub-space method. In the embodiment, the description is made in the case of using a disturbance observer as an example.

Inputs to the dynamic behavior constant estimation unit F10 are the electric power system measurement value and the electric power system configuration information. The electric power system measurement value is time series data, such as phase difference angles and angular velocity measured by a phase measuring device and an electric power demand by a load. The electric power system configuration information is system topologies showing the connection relationship of the electric power system and known dynamic behavior constants, for example. The dynamic behavior constant estimation unit F10 configures a state space model expressed in Equations 1 and 2 below using the electric power system measurement value and the electric power system configuration information. In the case of using a disturbance observer, the dynamic behavior constant estimation value is calculated by correcting a known dynamic behavior constant (in the following, referred to as an initial dynamic behavior constant) in the initial state in calculation.

$$dx/dt = Ax + Bu + e \quad \text{(Equation 1)}$$

$$y = Cx + Du \quad \text{(Equation 2)}$$

In Equations 1 and 2, the state vector x is the phase difference angle and the angular velocity from the equilibrium point of the node of the electric power system. The input vector u is the machine input or the load demand of the power generator node. The state matrix A corresponds to the coefficient matrix of a differential equation relating to a time variation in the state vector x. The state matrix A is configured including an inertia constant $M\_n$, a damping factor $D\_n$, and a synchronizing power coefficient $K\_nm$ based on the system topology. Numerical subscripts n and m express power generator node numbers. Similarly, the input matrix B is configured including the inertia constant $M\_n$ based on the system topology. Here, for simplifying the discussion, the output vector y is a value that the state vector x is directly measured. In this case, the output matrix C is a unit matrix, and the direct matrix D is a zero matrix. e is the disturbance vector.

To the state space model expressed by Equations 1 and 2, the disturbance observer is configured by Equations 3 and 4 below.

$$dx'/dt = A'x' + B'u \quad \text{(Equation 3)}$$

$$dx'\_h/dt = (A' - LC')x'\_h + B'u + Ly \quad \text{(Equation 4)}$$

In Equation 3, the vector x' is an extended state vector configured of the state vector x and the disturbance vector e. In Equation 4, the vector $x'\_h$ is the estimation value of the extended state vector x'. The matrices A', B', and C' are extended system matrices corresponding to the extended state vector x'. The matrix L is an observer gain. The sequential calculation of Equation 4 obtains the estimation value of the extended state vector x', i.e., the estimation values of the state vector x and the disturbance vector e. Here, the disturbance vector e is decomposed as in Equation 5 below.

$$e(t) = \Delta A x(t) + \Delta B u(t) + r(t) \quad \text{(Equation 5)}$$

Here, the state vector x, the input vector u, the disturbance vector e, and the external disturbance vector r are explicitly pointed out as time series data, and are written in x(t), u(t), e(t), and r(t). The matrices ΔA and ΔB are deviation matrices corresponding to deviations from the true values of the state matrix A and the input matrix B. As described above, in the disturbance observer, the deviation matrices are included in the disturbance vector.

In order to estimate the deviation matrices and the deviations of the inertia constant, the damping factor, and the synchronizing power coefficient configuring the deviation matrices from Equation 5, the deviations are calculated at the regression analysis of Equations 6 and 7 below on the basis of the premise that time series data of the individual elements of the state vector x, the input vector u, and the external disturbance vector r, is linearly independent from one another.

$$\text{trans}(\Delta G\_i) = \text{inv}(\text{trans}(Z(t))Z(t))\text{trans}(Z(t))e\_i(t) \quad \text{(Equation 6)}$$

$$\Delta G\_i = [\Delta A\_i1, \Delta A\_i2, \ldots, \Delta B\_i1, \Delta B\_i2, \ldots] \quad \text{(Equation 7)}$$

$$Z(t) = [x\_1(t), x\_2(t), \ldots, u\_1(t), u\_2(t), \ldots] \quad \text{(Equation 8)}$$

In Equation 6, trans( ) expresses the transpose operation, and inv( ) expresses the inverse matrix operation. $e\_i(t)$ expresses time series data of the ith element of the disturbance vector estimation value. In Equation 7, $\Delta A\_{ij}$ expresses the (i,j) element of the deviation matrix $\Delta A$, and the same thing is applied to $\Delta B\_{ij}$. In Equation 8 above, $x\_j(t)$ expresses time series data of the jth element of the state vector x, and the same thing is applied to $u\_j(t)$.

The estimation values of $\Delta A\_{ij}$ and $\Delta B\_{ij}$ obtained by solving Equations 6, 7, and 8 are expressed as the functions of the inertia constant deviation $\Delta M\_n$, the damping factor deviation $\Delta D\_n$, and the synchronizing power coefficient deviation $\Delta K\_{nm}$. Thus, the estimation values of $\Delta M\_n$, $\Delta D\_n$, and $\Delta K\_{nm}$ can be calculated by solving the simultaneous equations of the estimation values of $\Delta A\_{ij}$ and $\Delta B\_{ij}$. From the arithmetic operations above, the dynamic behavior constant estimation unit F10 outputs the dynamic behavior constant estimation values.

Next, an example of a calculating method at the relative accuracy calculation unit F11 will be described. The relative accuracy calculation unit F11 calculates the relative accuracy index that indicates the accuracy of the estimation values of the dynamic behavior constant deviations, focusing attention on Equations 5, 6, 7, and 8.

As shown in Equation 5, the disturbance vector e is the linear synthesis of the state vector x, the input vector u, and the external disturbance vector r using the deviation matrices $\Delta A$ and $\Delta B$ as coefficients. Using the symbols of Equations 7 and 8, when a signal has a larger value that is expressed by $\Delta G\_{ij} \times Z\_j(t)$, the signal has a stronger strength in the linear synthesis of Equation 5. In regression analysis of Equation 6, a signal having a stronger strength in Equation 5 is not prone to be affected by the external disturbance vector r, and the deviation matrix element that is the coefficient of the signal can be highly accurately calculated. Therefore, with a signal having a stronger strength in Equation 5, the corresponding dynamic behavior constant deviation can also be highly accurately calculated. Consequently, with the use of $\Delta G\_{ij} \times Z\_j(t)$ as an index that indicates the estimation accuracy of the deviation matrix and the corresponding dynamic behavior constant deviation, an estimation accuracy index $\eta$ is defined as in Equation 9. Here, log10 expresses a common logarithm, and var expresses a variance.

$$\eta\_{ij} = \log 10(\text{var}(\Delta G\_{ij} \times Z\_j(t))) \quad \text{(Equation 9)}$$

However, $\Delta A\_{ij}$ and $\Delta AB\_{ij}$ configuring $\Delta G\_{ij}$ are unknown values that have to be estimated. Thus, the direct calculation of Equation 9 is not allowed. Therefore, in the embodiment, $A\_{ij}$ and $B\_{ij}$ are used instead of $\Delta A\_{ij}$ and $\Delta B\_{ij}$, and a relative accuracy index $\eta'$ is defined as in Equations 10 and 11 below.

$$\eta\_{ij} = \log 10(\text{var}(G\_{ij} \times Z\_j(t))) \quad \text{(Equation 10)}$$

$$G\_i = [A\_i1, A\_i2, \ldots, B\_i1, B\_i2, \ldots] \quad \text{(Equation 11)}$$

The value of the relative accuracy index $\eta'$ is different from the value of the estimation accuracy index $\eta$. However, it is assumed that the values of $\Delta A\_{ij}$ and $\Delta B\_{ij}$ are respectively proportional to the values of $A\_{ij}$ and $B\_{ij}$, the relative size relationship between the indexes $\eta'$ and $\eta$ is the same order. Actually, this assumption is not strictly held. However, Equations 9 and 10 are expressed by the common logarithm. The relative accuracy index $\eta'$ is an index that approximates the size relationship of the estimation accuracy index $\eta$ in the order.

Note that, the relative accuracy index is described by the variance of $\Delta G\_{ij} \times Z\_j(t)$, which is non-limiting. For example, the relative accuracy index may be normalized using the variance of the external disturbance r(t). Alternatively, in the case where the variance of the external disturbance r(t) is unknown, the relative accuracy index is normalized using the variance of the estimation value of the disturbance e(t), and hence the relative accuracy index can be described as the magnitude of the signal strength to disturbance. The description using the variance may be substituted by another statistical index that indicates signal strength.

An example of a calculating method at the estimation error calculation unit F12 will be described. The estimation error calculation unit F12 calculates estimation errors by the following process based on reference power generator information that is an input to the electric power system monitoring apparatus 1, the dynamic behavior constant estimation value calculated at the dynamic behavior constant estimation unit F10, and the relative accuracy index $\eta'$ calculated at the relative accuracy calculation unit F11.

FIG. 4 shows an example of a table T10 that manages reference power generator information. The reference power generator information management table T10 manages reference power generator nodes having a known dynamic behavior constant, for example, associating a node number C100 with a dynamic behavior constant C101 to be the reference. The power generator node having a known dynamic behavior constant is the power generator node of a single power generator having a calibrated constant or the power generator node of a distributed power supply whose dynamic behavior is simulated in a pseudo manner by power electronics control, for example.

FIG. 5 is an example of a dynamic behavior constant estimation value management table T11 that manages dynamic behavior constant estimation values calculated at the dynamic behavior constant estimation unit F10. Similarly to the reference power generator information management table T10, the dynamic behavior constant estimation value management table T11 manages a power generator node number C110 that identifies the power generator node and a dynamic behavior constant estimation value in association with each other. Note that, in FIGS. 4 and 5, the inertia constants are shown as examples of dynamic behavior constants. However, similar tables are also provided for the damping factor and the synchronizing power coefficient.

With the comparison of the table T10 in FIG. 4 with the table T11 in FIG. 5, a reference estimation error $\zeta$ can be calculated on the reference power generator node as in Equation 12 below. Here, in the dynamic behavior constants, the inertia constant will be described as an example.

$$\zeta(M)\_n = ((M0\_n + \Delta M\_n) - M\_n)/M\_n \quad \text{(Equation 12)}$$

$\zeta(M)\_n$ is a reference estimation error relating to the inertia constant of a reference power generator node n. $M0\_n$ and $\Delta M\_n$ are an initial dynamic behavior constant and a deviation estimation value, respectively, relating to the inertia constant of the reference power generator node n at the dynamic behavior constant estimation unit F10. $M\_n$ is the inertia constant of the reference power generator node n.

Figure 6:
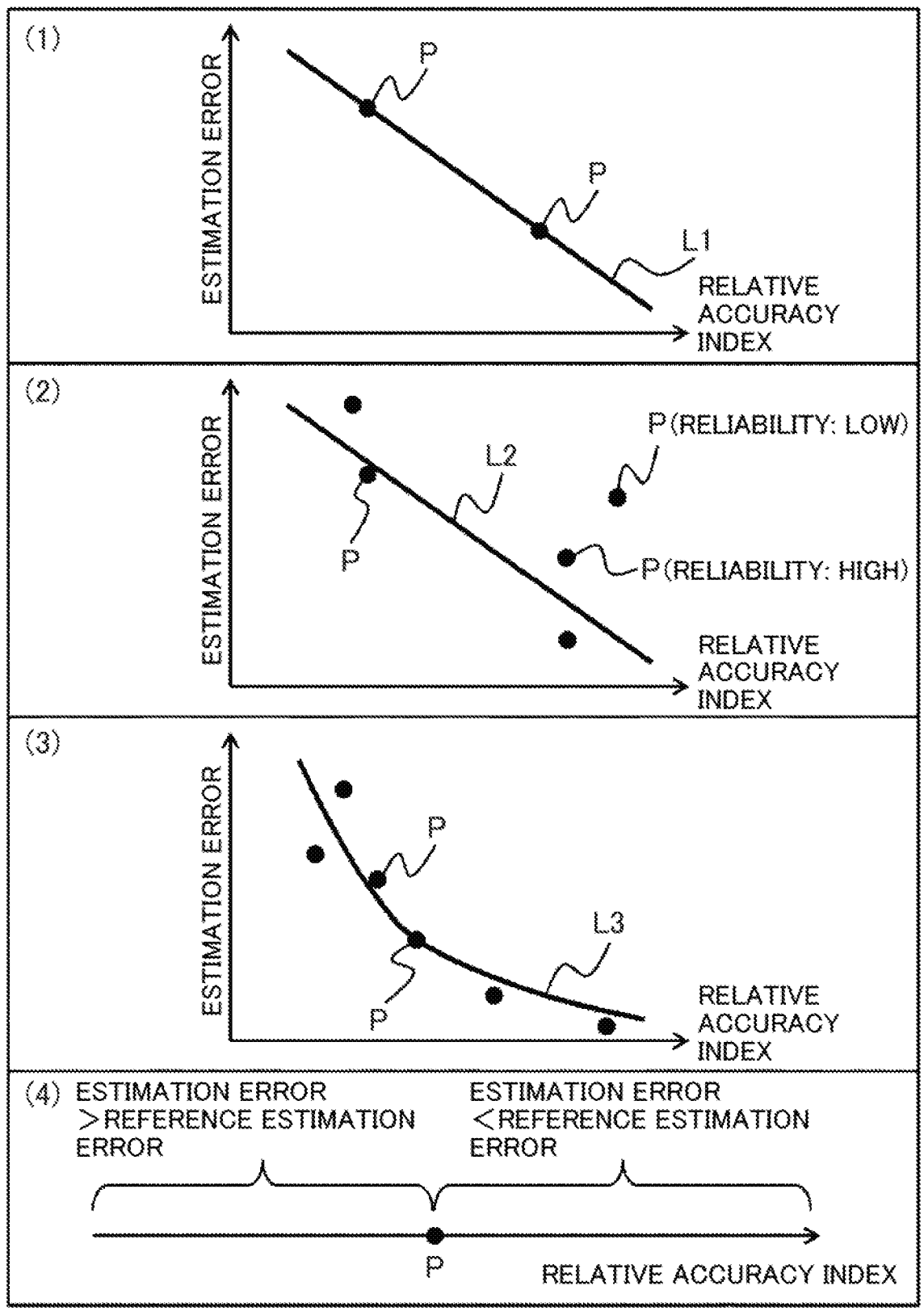
FIG. 6 shows schematic diagrams illustrating a calculating method for estimation errors.

FIG. 6 shows graphs that plot a relative accuracy index $\eta'(M)\_n$ calculated at the relative accuracy calculation unit F11 and the reference estimation error $\zeta(M)\_n$ obtained from Equation 12. Note that, $\eta'(M)\_n$ is an element corresponding to the inertia constant of the power generator node n in the relative accuracy index $\eta'\_ij$ in Equation 10.

As illustrated in (1) in FIG. 6, in the case where the reference power generator node has two plots P or more, the relationship between the relative accuracy index $\eta'(M)\_n$ and the reference estimation error $\zeta(M)\_n$ is approximated to a straight line L1, and hence the relative accuracy index of another power generator node can be converted into an estimation error.

As illustrated in (2) in FIG. 6, in the case where the reference power generator node has a plurality of plots P with different reliabilities, the reference estimation error $\zeta(M)\_n$ is weighted on the plurality of plots P, and approximated to a straight line L2, and then the relative accuracy index is converted into an estimation error.

As illustrated in (3) in FIG. 6, in the case where the reference power generator node has a sufficiently large number of plots P, an approximation to a curve L3 can also convert the relative accuracy index into an estimation error, instead of an approximation to a straight line. Through the processes above, the estimation error calculation unit F12 associates the relative accuracy index with the estimation error, and calculates estimation errors relating to the dynamic behavior constants of the power generator nodes.

As illustrated in (4) in FIG. 6, even though the reference power generator node has one plot P, plotting a reference estimation error on a number line allows the determination of the size of the estimation error of another power generator node to the reference estimation error. This method is effective in estimating the dynamic behavior constants all the time, for example, in the case of adopting only the estimation result of the dynamic behavior constant of a power generator having an estimation error smaller than the reference estimation error at the timing at which the reference estimation error becomes sufficiently small.

Figure 7:
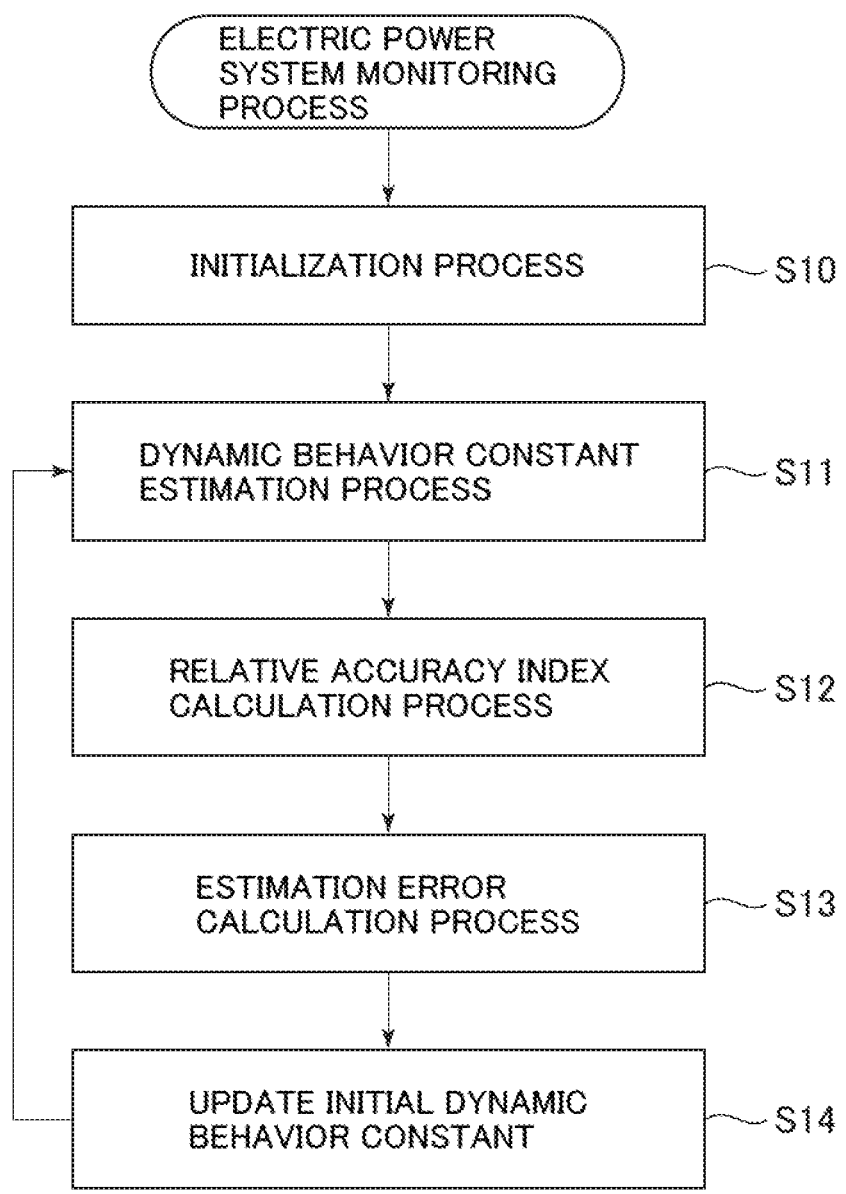
FIG. 7 is a flowchart of a process for monitoring an electric power system.

FIG. 7 is a flowchart of a process performed by the electric power system monitoring apparatus 1. First, the electric power system monitoring apparatus 1 performs an initialization process, and sets an initial dynamic behavior constant (S10). The electric power system monitoring apparatus 1 estimates a dynamic behavior constant using the dynamic behavior constant estimation unit F10 (S11). The dynamic behavior constant estimation unit F10 outputs a dynamic behavior constant estimation value to the estimation information recorder 7 described in FIG. 1. The estimation information recorder 7 records the received dynamic behavior constant estimation value in association with an estimation error that is to be received in Step S13.

The electric power system monitoring apparatus 1 calculates a relative accuracy index that is an index indicating the accuracy of the dynamic behavior constant estimation value using the relative accuracy calculation unit F11 (S12). The electric power system monitoring apparatus 1 calculates an estimation error using the estimation error calculation unit F12 (S13). The estimation error calculation unit F12 sends the calculated estimation error to the estimation information recorder 7.

The electric power system monitoring apparatus 1 performs Steps S10 to S13 described above to output the dynamic behavior constant estimation value and the estimation error to the estimation information recorder 7 and other devices. In the embodiment, Step S14 is performed as an additional process. In Step S14, the electric power system monitoring apparatus 1 compares a preset error threshold with the estimation error, and updates the initial dynamic behavior constant for the dynamic behavior constant whose estimation error is below the error threshold. As described above, the electric power system monitoring apparatus 1 repeatedly performs Steps S11 to S14 to sequentially improve the accuracy (estimation accuracy) of the initial dynamic behavior constant. The estimation error that is previously estimated may be used as a new error threshold.

As described above, in accordance with the embodiment thus configured, dynamic behavior constants can be estimated using measurement signals obtained from the electric power system, and the accuracy of the estimation results of the dynamic behavior constants can be obtained. Consequently, in accordance with the embodiment, after the accuracy of a dynamic behavior constant estimation value is grasped, the process using the dynamic behavior constant estimation value can be performed.

In the embodiment, there is no necessity to wait for the occurrence of a large disturbance as in previously existing techniques. The dynamic behavior constant is estimated from given weak measurement signals observed in the electric power system, and the accuracy of the estimated dynamic behavior constant can be determined. Therefore, the electric power system monitoring apparatus 1 can use the dynamic behavior constant estimation value after confirming the estimation error, and can monitor the state of the electric power system.

In the embodiment, the accuracy of the dynamic behavior constant estimation value can be determined. Thus, the accuracy of the initial dynamic behavior constant can be sequentially improved. Accordingly, the electric power system monitoring apparatus 1 enables the automatic improvement of the performance of monitoring the electric power system. Thus, the reliability and user usability of the electric power system monitoring apparatus 1 can be improved.

Second Embodiment

Figure 8:
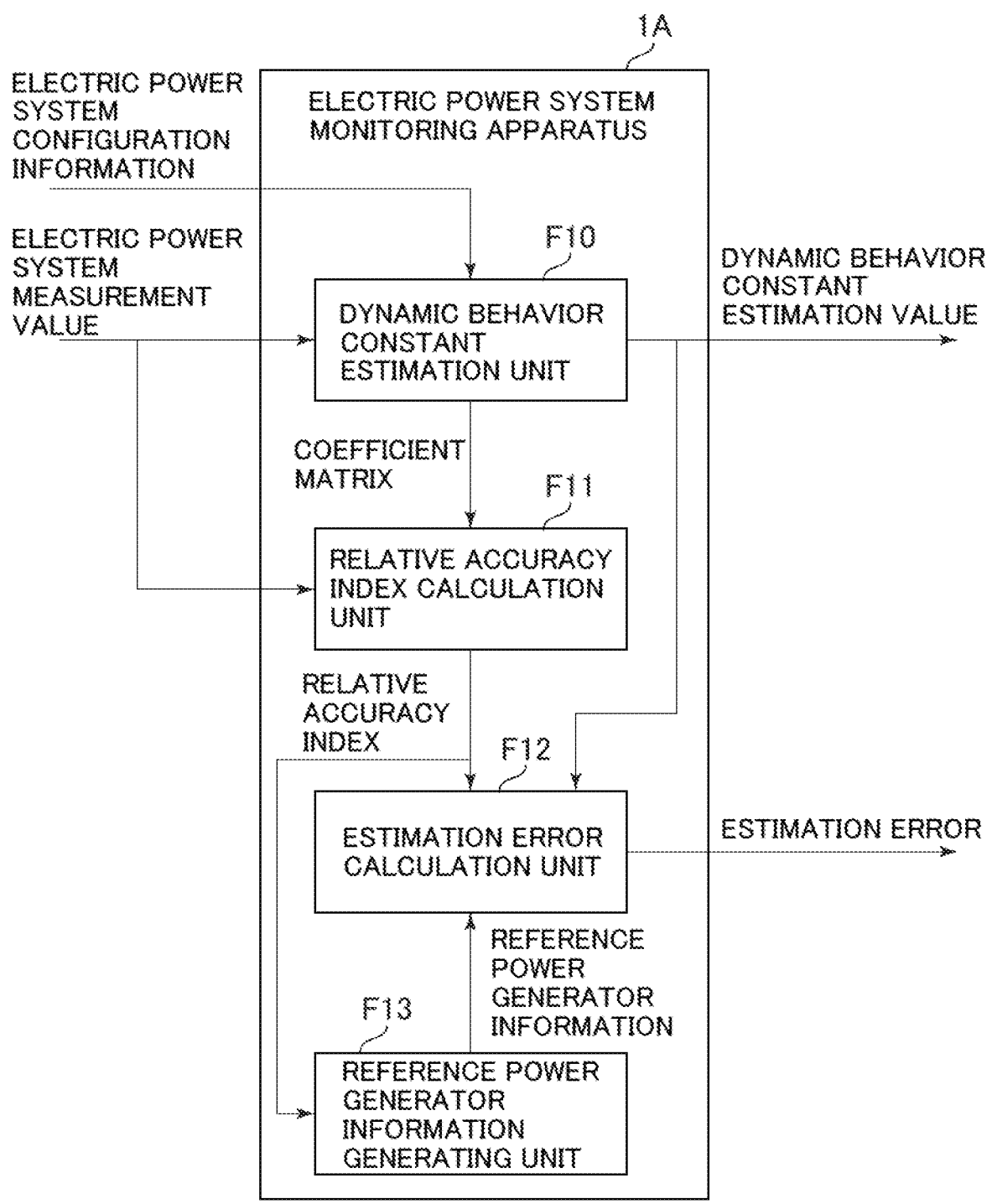
FIG. 8 is a functional block diagram of an electric power system monitoring apparatus according to a second embodiment.
Figure 9:
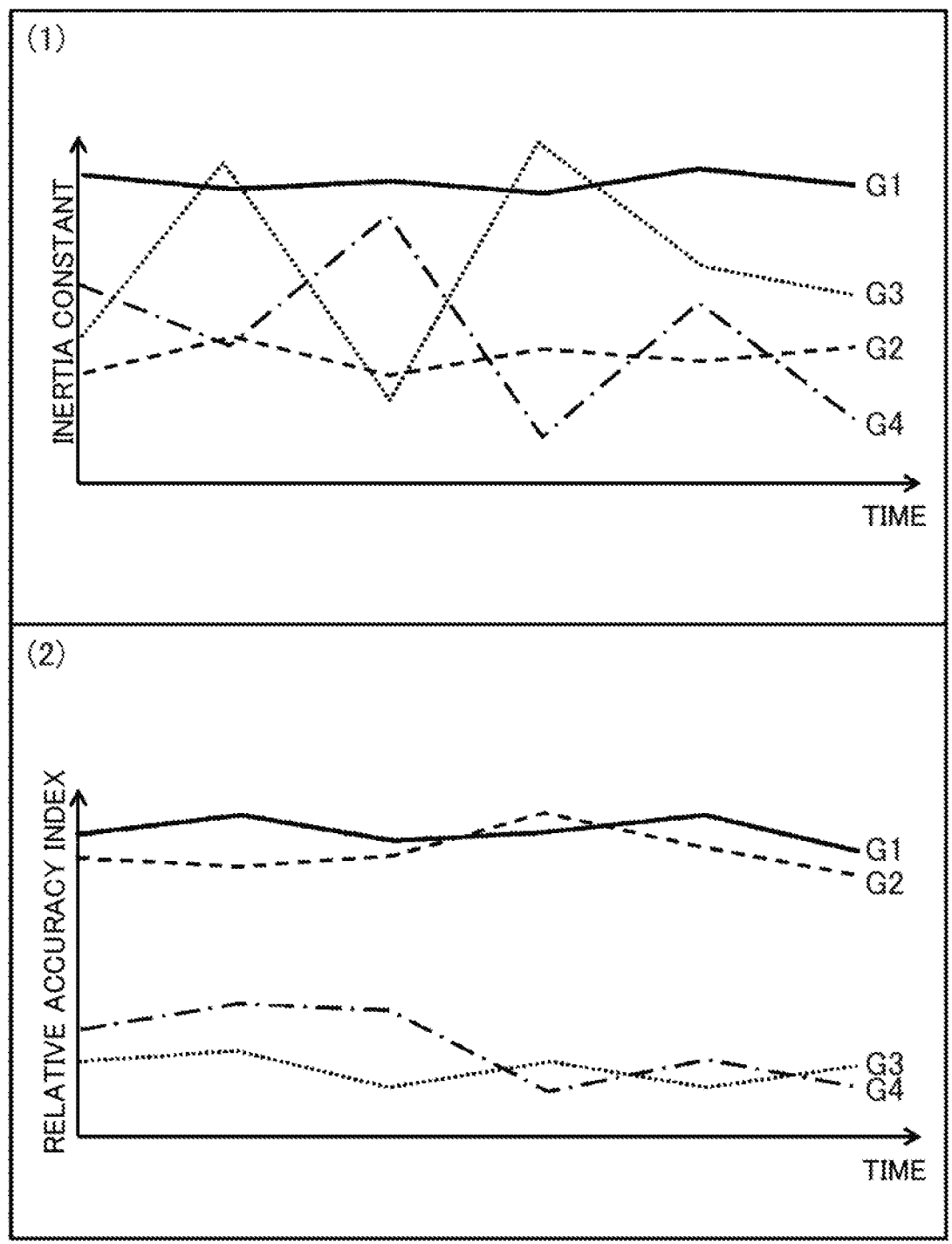
FIG. 9 is an illustration of a method for generating reference power generator information.
Figure 10:
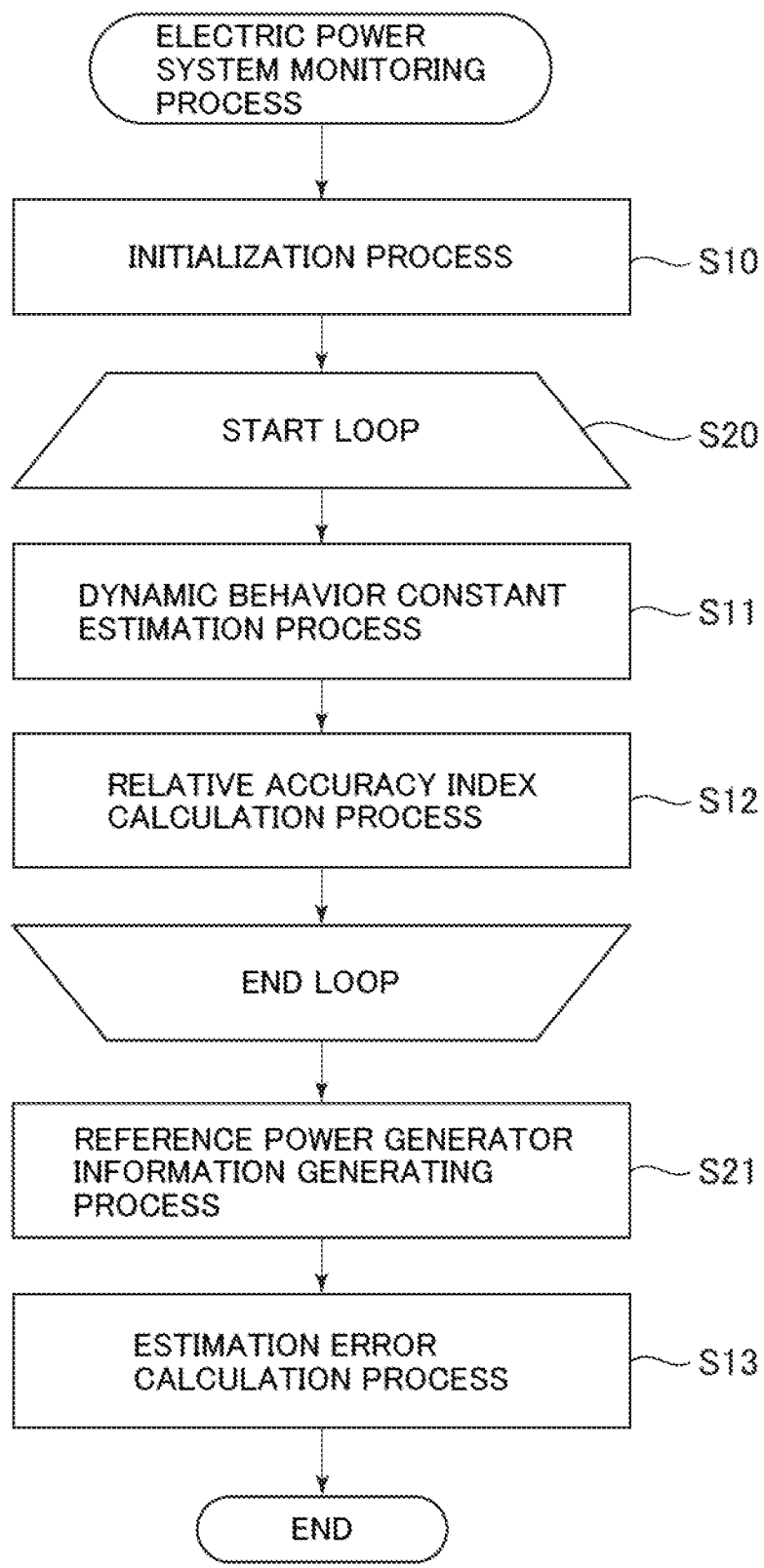
FIG. 10 is a flowchart of a process for monitoring an electric power system.

Referring to FIGS. 8 to 10, a second embodiment will be described. Since the following embodiments including the second embodiment correspond to exemplary modifications of the first embodiment, differences from the first embodiment will be mainly described. In the embodiment, the case will be described in which reference power generator information is generated in the inside of an electric power system monitoring apparatus 1A.

FIG. 8 shows the functional configuration of the electric power system monitoring apparatus 1A according to the embodiment. The electric power system monitoring apparatus 1A includes a dynamic behavior constant estimation unit F10, a relative accuracy calculation unit F11, and an estimation error calculation unit F12 described in FIG. 1. The electric power system monitoring apparatus 1A according to the embodiment further includes a reference power generator information generating unit F13 to generate reference power generator information.

The reference power generator information generating unit F13 receives an input of a relative accuracy index calculated at the relative accuracy calculation unit F11, generates reference power generator information by calculation, and outputs the generated reference power generator information to the estimation error calculation unit F12.

FIG. 9 shows an example of a method for generating reference power generator information. In the following, the description is made in which the relative accuracy index η'(M)_n relating to the inertia constants of the power generator nodes is taken as an example.

(1) in FIG. 9 shows a time variation in the inertia constant (the estimation value) of a plurality of power generator nodes. (1) in FIG. 9 is obtained by performing the process at the dynamic behavior constant estimation unit F10 for a plurality of times. The horizontal axis in (1) in FIG. 9 expresses time, and the vertical axis expresses the size of the inertia constant estimation value. Lines plotted on (1) in FIG. 9 show time variations in the inertia constant estimation values of the power generator nodes.

(2) in FIG. 9 shows a time variation in the relative accuracy index of the inertia constant estimation values shown in (1) in FIG. 9. (2) in FIG. 9 is obtained by performing the process at the relative accuracy calculation unit F11 for a plurality of times. The horizontal axis in (2) in FIG. 9 expresses time, and the vertical axis expresses the size of the relative accuracy index. Lines plotted on (2) in FIG. 9 show time variations in the relative accuracy index η'(M)_n of the power generator nodes.

Power generator nodes having an inertia constant of stable, high estimation accuracy (e.g. G1 and G2) have a small change in the inertia constant estimation value. Thus, the relative accuracy indexes of the power generator nodes maintain a large value. Therefore, the reference power generator information generating unit F13 selects one or a plurality of the reference power generator nodes G1 and G2 in the descending order of the mean value of the relative accuracy index in (2) in FIG. 9. The reference power generator information generating unit F13 then calculates statistical representative values, such as mean values and medians, on the inertia constants of the reference power generator node G1 and G2 in (1) in FIG. 9, and outputs the calculation result as reference power generator information to the estimation error calculation unit F12.

In the embodiment, reference power generator information is generated based on the relative accuracy index that indicates the accuracy of the inertia constant estimation value as described above. Since the reference power generator information thus generated is used instead of reference power generator information set in the first embodiment, the reference power generator information can also be referred to as alternate reference power generator information.

Instead of the method described in FIG. 9, a configuration may be possible in which a statistical range, such as standard deviation, is calculated on the inertia constants of the alternate reference power generator nodes G1 and G2 in (1) in FIG. 9, and the calculation result is used as the alternate value of the reference estimation error in Equation 12.

FIG. 10 is a flowchart of an electric power system monitoring process executed by the electric power system monitoring apparatus 1A according to the embodiment. This process includes an iteration process S20 for calculating statistic values at the reference power generator information generating unit F13.

First, the electric power system monitoring apparatus 1A executes an initialization process for setting an initial dynamic behavior constant (S10). The electric power system monitoring apparatus 1A executes a dynamic behavior constant estimation process (S11) at the dynamic behavior constant estimation unit F10 and a relative accuracy index calculation process (S12) at the relative accuracy calculation unit F11 as the iteration process (S20).

The electric power system monitoring apparatus 1A executes Steps S11 and S12 until the number of times of execution reaches a pre-specified number of times or until the statistical representative values of the dynamic behavior constant converge. Upon finishing the iteration process, the electric power system monitoring apparatus 1A instructs the reference power generator information generating unit F13 to generate reference power generator information (S21). The estimation error calculation unit F12 calculates an estimation error based on the reference power generator information generated at the reference power generator information generating unit F13 and the relative accuracy index calculated at the relative accuracy calculation unit F11 (S13).

The embodiment thus configured also exerts the operation and effect similar to the first embodiment. In the embodiment, even in the case where no reference power generator information is set, reference power generator information can be generated in the inside of the electric power system monitoring apparatus 1A. The dynamic behavior constant that is reference power generator information generated at the reference power generator information generating unit F13 according to the embodiment is not always accurate. However, even in the case where no reference power generator information is externally obtained, the dynamic behavior constant can be estimated, and the accuracy of the dynamic behavior constant estimation value can be calculated. Accordingly, user usability is improved.

Third Embodiment

Figure 11:
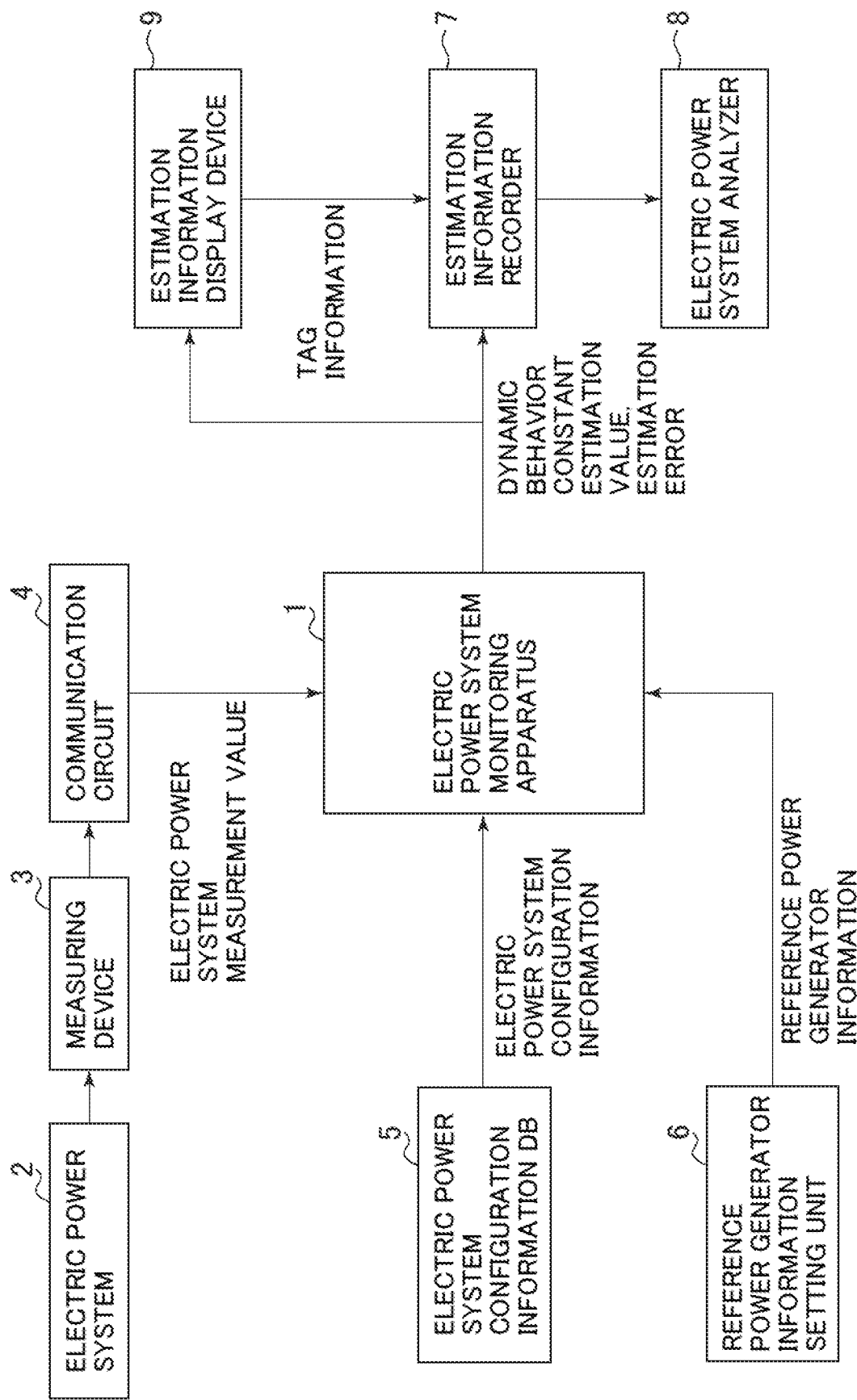
FIG. 11 is a block diagram of a system including an electric power system monitoring apparatus according to a third embodiment.
Figure 12:
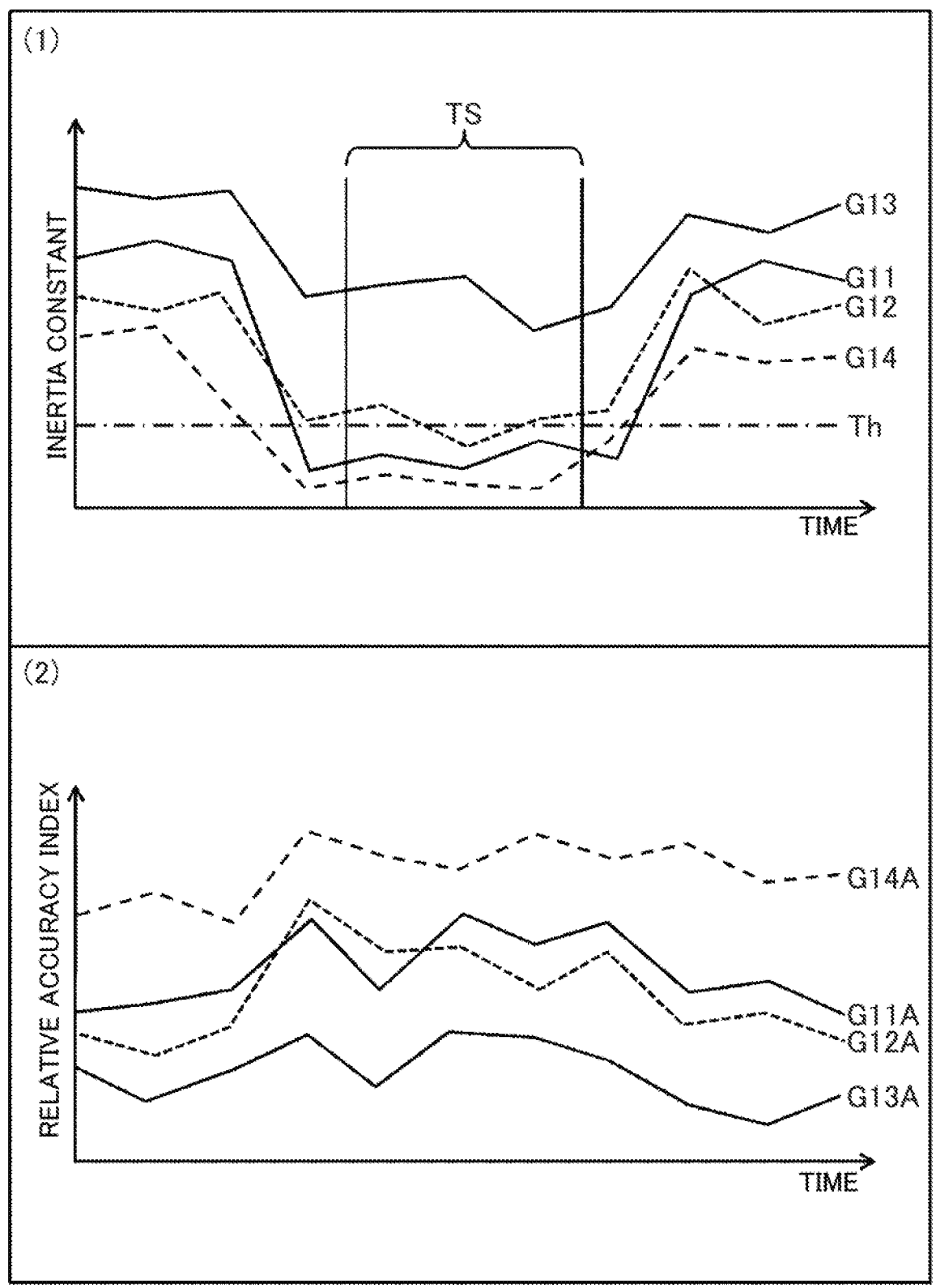
FIG. 12 is an illustration of a method for extracting a dynamic behavior constant of high estimation accuracy.

Referring to FIGS. 11 and 12, a third embodiment will be described. In the embodiment, the electric power system monitoring apparatus 1 is in connection to an estimation information display device 9 to provide a dynamic behavior constant estimation value and its error to a user.

The estimation information display device 9 receives a dynamic behavior constant estimation value and an estimation error from the electric power system monitoring apparatus 1, and displays the value and the error on a screen. The estimation information display device 9 then outputs tag information to an estimation information recorder 7.

The estimation information display device 9 may be configured as a computer separate from the electric power system monitoring apparatus 1, or may be provided as the function of the electric power system monitoring apparatus 1 in the inside of the electric power system monitoring apparatus 1. Alternatively, the estimation information display device 9 may be integrated with the estimation information recorder 7. Note that, the estimation information recorder 7 and the estimation information display device 9 may be provided in the inside of the electric power system monitoring apparatus 1.

FIG. 12 shows exemplary screens displayed by the estimation information display device 9. The horizontal axis in (1) and (2) in FIG. 12 expresses a time base. Every time when Steps S11 to S13 are repeated in the processes in FIG. 7, the time base goes forward. The vertical axis in (1) in FIG. 12 expresses the size of the estimation error of the dynamic behavior constant. The vertical axis in (2) in FIG. 12 expresses the size of the relative accuracy index.

Solid lines G11 and G12 in (1) in FIG. 12 express reference estimation errors relating to reference power generator nodes, and dotted lines G13 and G14 express estimation errors calculated at the estimation error calculation unit F12 on the other power generator nodes. Thick lines G11A and G12A in (2) in FIG. 12 are relative accuracy indexes relating to reference power generator nodes, and thin lines G13A and G14A are relative accuracy indexes relating to the other power generator nodes.

The estimation error of the dynamic behavior constant and the relative accuracy index are changed depending on the size of the signal strength of the electric power system measurement value inputted to the electric power system monitoring apparatus 1. Thus, in order to obtain a dynamic behavior constant estimation value of high estimation accuracy, the selective extraction of the calculation result is necessary at the timing at which the signal strength of the electric power system measurement value is large.

For the method, for example, filtering is performed on the estimation error calculated at the estimation error calculation unit F12 by setting a threshold Th on the screen in (1) in FIG. 12. Thus, only estimation values that are estimation errors not greater than the threshold Th can be automatically extracted.

Alternatively, a method may be possible with which an estimation result with a large relative accuracy index is selected on each of the power generator nodes on the time base in (2) in FIG. 12, an estimation value corresponding to the estimation result is extracted, and hence a dynamic behavior constant estimation value of relatively high estimation accuracy can be obtained.

The dynamic behavior constant estimation value of high estimation accuracy can also be manually extracted. For example, a user (an operator) selects, on the screen in (1) in FIG. 12, a period TS for which reference estimation errors are sequentially small. The electric power system monitoring apparatus 1 extracts an estimation value on a power generator node having an estimation error smaller than the threshold Th or on a power generator node having a relative accuracy index greater than the reference power generator node in the selected period TS.

As described above, the estimation value can be extracted using the estimation information display device 9. To the extracted estimation value, tag information is added. With the addition of the tag information, the extracted estimation value is sorted in association with the dynamic behavior constant estimation value and the estimation error at the estimation information recorder 7.

The electric power system analyzer 8 can perform calculation based on the dynamic behavior constant estimation value of higher accuracy in system analysis using the dynamic behavior constant estimation value having tag information. Examples of system analysis include analysis of eigenvalues relating to the swing of the electric power system and control parameter design for reducing swings.

As described above, the embodiment thus configured also exerts the operation and effect similar to the first embodiment. In the embodiment, the electric power system can be monitored using the dynamic behavior constant estimation value calculated at the timing at which the signal strength of the electric power system measurement value is strong. Accordingly, reliability and usability are improved.

Fourth Embodiment

Figure 13:
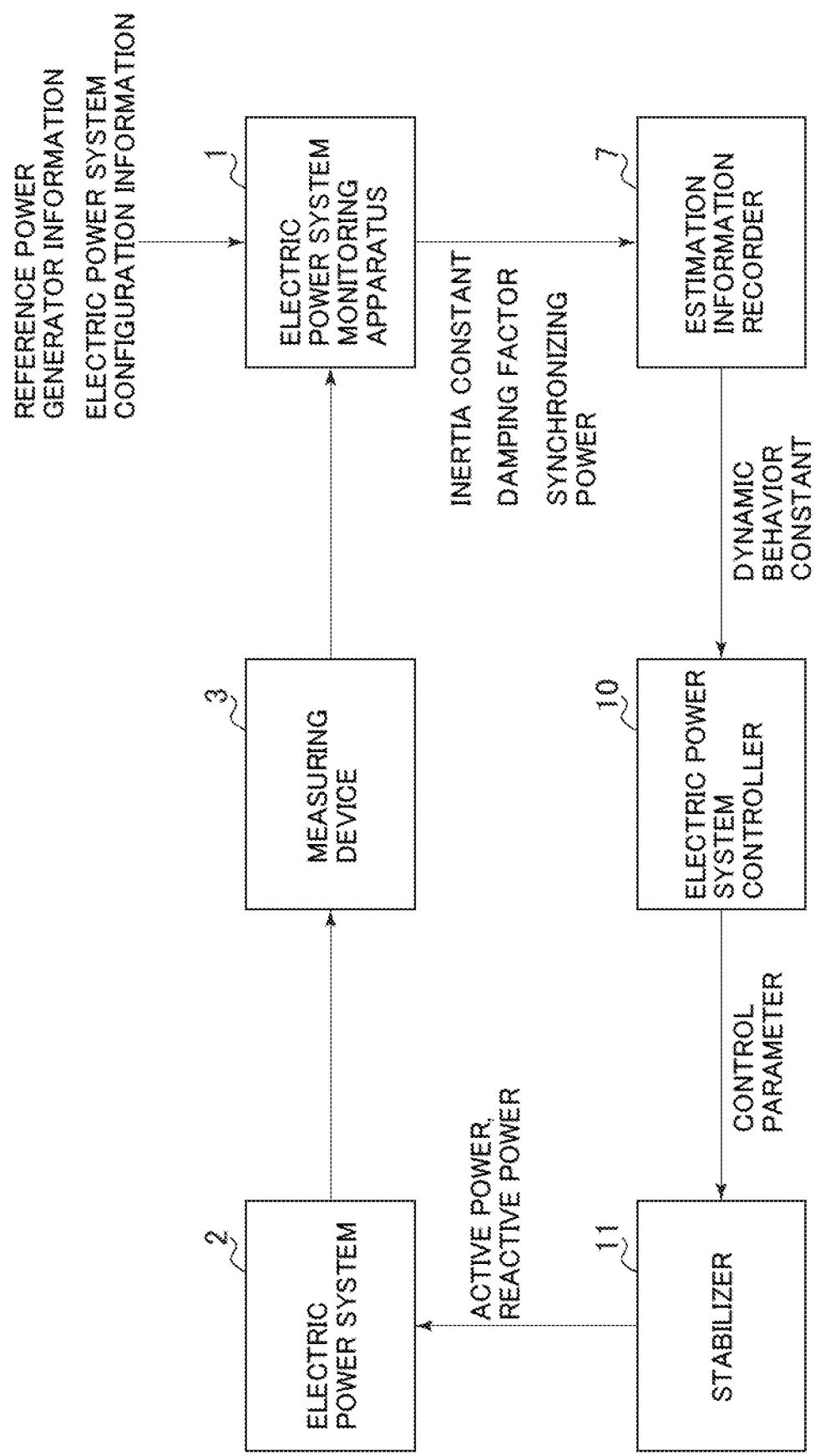
FIG. 13 is a block diagram of a system including an electric power system monitoring apparatus according to a fourth embodiment.

Referring to FIG. 13, a fourth embodiment will be described. In the embodiment, an example of utilization of the electric power system monitoring apparatus 1 will be described.

The electric power and the phase angle, which are the physical quantities of the electric power system 2, are measured by the measuring device 3. The electric power system monitoring apparatus 1 receives inputs of this measured information, reference power generator information, and electric power system configuration information, and calculates an estimation value of the dynamic behavior constant and its estimation error. The electric power system monitoring apparatus 1 outputs the estimation value of a dynamic behavior constant (the inertia constant, the damping factor, and the synchronizing power coefficient) having high accuracy in the calculation results to the estimation information recorder 7.

An electric power system controller 10 calculates a control parameter for a stabilizer 11 using dynamic behavior constants recorded on the estimation information recorder 7, and outputs the parameter. The stabilizer 11 outputs active power or reactive power, for example, to the electric power system 2 based on the control parameter.

As described above, in the embodiment thus configured, the electric power system monitoring apparatus 1 estimates the dynamic behavior constants of the electric power system 2 all the time, and the electric power system controller 10 determines the control parameter for the stabilizer 11 using estimation values of high accuracy among estimation values. Accordingly, in the embodiment, the synchronization stability of the electric power system 2 can be improved.

Note that, the present invention is not limited to the foregoing embodiments, and can include various exemplary modifications. For example, the embodiments are described in detail for easily understanding the present invention. The embodiments are not necessarily limited to ones having all the described configurations. The configuration of an embodiment can also be replaced by the configuration of another embodiment. The configuration of another embodiment can also be added to the configuration of an embodiment. On a part of the configurations of the embodiments, another configuration can be added, removed, and replaced. Note that, technical features included in the embodiment can make combinations other than the combinations described in claims.

LIST OF REFERENCE SIGNS 1, 1A: electric power system monitoring apparatus,
2: electric power system,
3: measuring device,
4: communication circuit
5: electric power system configuration information database,
6: reference power generator information setting unit,
7: estimation information recorder,
8: electric power system analyzer,
9: estimation information display device,
10: electric power system controller,
11: stabilizer,
F10: dynamic behavior constant estimation unit,
F11: relative accuracy calculation unit,
F12: estimation error calculation unit,
F13: reference power generator information generating unit

The invention claimed is:

1. An electric power system monitoring apparatus comprising:
a processor; and
a memory coupled to the processor and storing a program which, when executed by the processor, causes the processor to
estimate a predetermined dynamic behavior constant from a measurement signal obtained from a measurement device that measures voltage, frequency, phase angle, and electric power of an electric power system;
calculate, from the measurement signal, a relative accuracy index that indicates accuracy of a dynamic behavior constant estimation value estimated by the processor;
calculate an estimation error from reference dynamic behavior information, the dynamic behavior constant estimation value, and the relative accuracy index; and
output the dynamic behavior constant estimation value to an electric power system controller that determines a control parameter based on the dynamic behavior constant and outputs the control parameter to a power system stabilizer that outputs an active power or a reactive power to the electric power system based on the control parameter to improve synchronization stability of the electric power system.

2. The electric power system monitoring apparatus according to claim 1,
wherein the processor calculates the relative accuracy index based on signal strength of the measurement signal.

3. The electric power system monitoring apparatus according to claim 1,
wherein the processor calculates the relative accuracy index based on a product of signal strength of the measurement signal and a coefficient of a differential equation expressing a dynamic behavior of the electric power system.

4. The electric power system monitoring apparatus according to claim 1,
wherein the predetermined dynamic behavior constant includes a first dynamic behavior constant and a second dynamic behavior constant,
the measurement signal includes a first measurement signal used for estimating the first dynamic behavior constant and a second measurement signal used for estimating the second dynamic behavior constant, and
the processor calculates the relative accuracy index based on a size relationship between signal strength of the first measurement signal and signal strength of the second measurement signal.

5. The electric power system monitoring apparatus according to claim 1,
wherein the reference dynamic behavior information includes a number that indicates a reference power generator node having a known dynamic behavior constant and the dynamic behavior constant of the reference power generator node.

6. The electric power system monitoring apparatus according to claim 5,
wherein the reference power generator node is a single power generator node having a calibrated dynamic behavior constant or a distributed power supply node with a dynamic behavior of a synchronous generator simulated in a pseudo manner.

7. The electric power system monitoring apparatus according to claim 5,
wherein the processor:
calculates a reference estimation error that is an estimation error of the dynamic behavior constant relating to the reference power generator node by comparing the dynamic behavior constant estimation value with the reference dynamic behavior information, and
converts the relative accuracy index of another power generator node other than the reference power generator node into an estimation error by expressing the calculated reference estimation error in a function of the relative accuracy index.

8. The electric power system monitoring apparatus according to claim 7,
wherein while processes of the processor are repeatedly performed, a power generator node having the estimation error that is a smallest and a dynamic behavior constant estimation value of the power generator node are added to the reference dynamic behavior information every time the processes are performed.

9. The electric power system monitoring apparatus according to claim 1, wherein the processor calculates the reference dynamic behavior information from the relative accuracy index.

10. The electric power system monitoring apparatus according to claim 9,
wherein the processor generates the reference dynamic behavior information using a power generator node having the relative accuracy index that is the best and a dynamic behavior constant of the power generator node.

11. The electric power system monitoring apparatus according to claim 9,
wherein processes of the processor are repeatedly performed, and
the processor generates the reference dynamic behavior information using a power generator node having a mean value of the relative accuracy index that is the best and a dynamic behavior constant of the power generator node.

12. The electric power system monitoring apparatus according to claim 1, further comprising an estimation information display device to display the relative accuracy index and the estimation error.

13. The electric power system monitoring apparatus according to claim 12,
wherein among a plurality of the dynamic behavior constant estimation values, the dynamic behavior constant estimation value is outputted, the dynamic behavior constant estimation value being not greater than a threshold set to the estimation error displayed by the estimation information display device.

14. The electric power system monitoring apparatus according to claim 12,
wherein in the dynamic behavior constant estimation value, a result having high accuracy is selectively outputted by setting a threshold to the relative accuracy index on a screen of the estimation information display device.

15. An electric power system monitoring method using a computer, the method comprising:
acquiring a measurement signal from a measuring device provided on an electric power system;
estimating a predetermined dynamic behavior constant as a dynamic behavior constant estimation value from the measurement signal;

calculating a relative accuracy index that indicates accuracy of the dynamic behavior constant estimation value from the measurement signal;

acquiring reference dynamic behavior information that is a reference of the dynamic behavior constant estimation value;

calculating an estimation error from the reference dynamic behavior information, the dynamic behavior constant estimation value, and the relative accuracy index; and outputting the dynamic behavior constant estimation value to an electric power system controller that determines a control parameter based on the dynamic behavior constant and outputs the control parameter to a power system stabilizer that outputs an active power or a reactive power to the electric power system based on the control parameter to improve synchronization stability of the electric power system.

* * * * *